United States Patent
Hishinuma

(10) Patent No.: US 6,624,428 B2
(45) Date of Patent: Sep. 23, 2003

(54) PROCESS AND DEVICE FOR TREATMENT BY DIELECTRIC BARRIER DISCHARGE LAMPS

(75) Inventor: Nobuyuki Hishinuma, Himeji (JP)

(73) Assignee: Ushiodenki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/292,630

(22) Filed: Nov. 13, 2002

(65) Prior Publication Data
US 2003/0094909 A1 May 22, 2003

(30) Foreign Application Priority Data
Nov. 13, 2001 (JP) ......................... 2001-347699

(51) Int. Cl.$^7$ ............................... H01J 37/00
(52) U.S. Cl. ................. 250/492.1; 250/441.11
(58) Field of Search .................. 250/492.1, 441.11, 250/443.1, 492.2, 505.1

(56) References Cited

U.S. PATENT DOCUMENTS

| 4,983,881 A | 1/1991 | Eliasson et al. |
| 6,057,038 A | * 5/2000 | Terashita et al. ............ 428/447 |

FOREIGN PATENT DOCUMENTS

| DE | 40 22 279 A1 | 2/1991 |
| JP | 60 075327 A | 4/1985 |
| JP | 08-124540 A | 5/1996 |
| JP | 09-74079 A | 3/1997 |
| JP | 09-302326 A | 11/1997 |

OTHER PUBLICATIONS

Discharge Handbook, Electro Society, Jun. 1989, $7^{th}$ edition, p. 263.

* cited by examiner

Primary Examiner—Kiet T. Nguyen
(74) Attorney, Agent, or Firm—Nixon Peabody LLP; David S. Safran

(57) ABSTRACT

To advantageously eliminate the disadvantage of attenuation of the radiant light from dielectric barrier discharge lamps by a UV transmission component, a treatment device using dielectric barrier discharge lamps is provided with a lamp chamber in which dielectric barrier discharge lamps are located and in which there is an inert gas atmosphere; a treatment chamber, in which an article to be treated is located, is provided with a treatment gas atmosphere, and a UV transmission component by which the lamp chamber and the treatment chamber are separated from one another. In each of the lamp chamber and the treatment chamber there are devices for determining the gas pressure within the respective chamber, a supply arrangement for delivering gas to the inside the respective chamber and an arrangement for discharging gas from the respective chamber. A control device regulates the pressure of the gas atmosphere within the lamp chamber and the pressure of the gas atmosphere of the treatment chamber relative to one another by determining the gas pressures of the lamp chamber and the treatment chamber.

10 Claims, 2 Drawing Sheets

PROCESS AND DEVICE FOR TREATMENT BY DIELECTRIC BARRIER DISCHARGE LAMPS

BACKGROUND OF THE INVENTION

1. Field of the Invention

The invention relates to a treatment device using dielectric barrier discharge lamps. The invention relates especially to improvement of a treatment device in which dielectric barrier discharge lamps are used in which excimer molecules are formed by a dielectric barrier discharge, and in which the light emitted by these excimer molecules is caused to react using the treatment gas.

2. Description of Related Art

Japanese patent disclosure document HEI 9-302326 describes a UV treatment device in which a lamp chamber and a treatment chamber are separated from one another by a window component.

Figure 3:
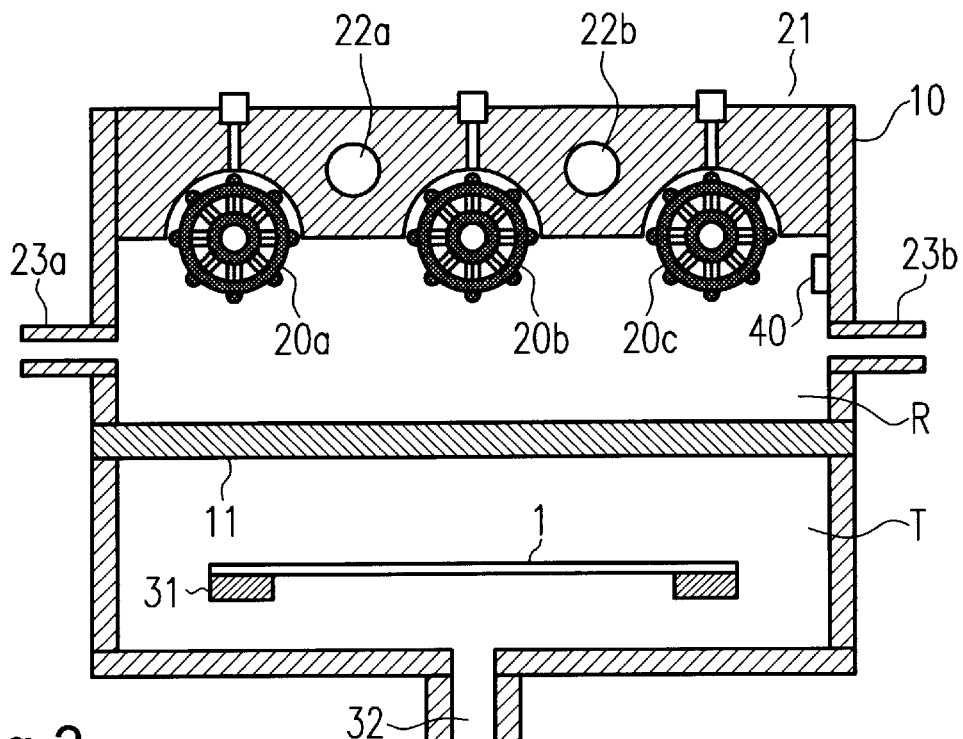

FIG. 3 shows the arrangement of such a UV treatment device. In the figure, a UV treatment device 10 has a lamp chamber R and a treatment chamber T which are separated from one another by a UV transmission window component 11 made, for example, of silica glass. In the lamp chamber R, there are dielectric barrier discharge lamps 20a, 20b, 20c in the groove of a metal block 21 in which there are cooling water passages 22a, 22b through which cooling water flows. This lamp chamber R is filled with inert gas and is provided with an inlet 23a and an outlet 23b through which the inert gas flows. In the treatment chamber T, the article 1 to be treated is placed on a holding frame 31 which receives the UV radiation emitted by the dielectric barrier discharge lamps 20. The treatment chamber T is also provided with an inlet 32 which is used to deliver treatment gas into the interior. The arrangement and the description of other details are described in addition in the detailed description of the invention.

Dielectric barrier discharge lamps 20 are disclosed, for example, in Japanese patent disclosure document HEI 2-7353 (U.S. Pat. No. 4,983,881). It describes a radiator, i.e., a dielectric barrier discharge lamp in which a discharge vessel is filled with a discharge gas which forms excimer molecules, in which furthermore excimer molecules are formed by a dielectric barrier discharge, which is also called an ozone production discharge or a silent discharge, as is described in the revised edition of the *Discharge Handbook*, Electro Society, June 1989, 7th edition, page 263, and in which light is emitted by the excimer molecules.

Furthermore, published German Patent Application DE 4022279 A1 discloses a dielectric barrier discharge lamp which is operated with a few MHz and in which the discharge vessel has a cylindrical shape, at least part of the discharge vessel acting as a dielectric which carries out the dielectric barrier discharge. At least part of this dielectric transmits vacuum UV light (light with wavelengths of less than or equal to 200 nm) which is emitted by the excimer molecules. In the dielectric barrier discharge lamp described herein, the outside of the discharge vessel is provided with a mesh electrode as one of the electrodes.

These dielectric barrier discharge lamps have various advantages which conventional low-pressure mercury discharge lamps and conventional high pressure arc discharge lamps do not have. One of the advantages is that vacuum UV light is intensively emitted with a single wavelength.

In the UV treatment device shown in FIG. 3, dry surface cleaning, surface oxidation, surface activation, photo-CVD treatment and the like of the article 1 to be treated can be carried out by the vacuum UV light emitted by the dielectric barrier discharge lamps, for example, by light with a wavelength of 172 nm.

The light emitted by the dielectric barrier discharge lamps here has a wavelength of at most 200 nm, specifically a wavelength of 172 nm, 146 nm, or 126 nm. There is the disadvantage that, upon passage through the UV transmission component, absorption by this component takes place and therefore the amount of light is reduced. This reduction of the amount of light means a reduction in the amount of light which reaches the article 1 to be treated; this results in the major disadvantage that the above described treatment cannot be advantageously carried out.

In a low-pressure mercury lamp which emits light with a wavelength of 254 nm, this reduction in the amount of light by the UV transmission component does not occur to a degree which is a problem in practice. It can be stated that it is a new task which clearly arises in a dielectric barrier discharge lamp which emits UV light with a wavelength of less than or equal to 200 nm, more specifically less than or equal to 172 nm.

On the other hand, in this device, the UV transmission component is indispensable. The reason for this is the following:

1. The dielectric barrier discharge lamp has a special arrangement in which there is an electrode on the outside of the discharge vessel. The UV transmission component is used to prevent the extremely small parts of the electrode from vaporizing and precipitating on the article to be treated.
2. Since the vacuum UV light which is emitted by the dielectric barrier discharge lamps is absorbed by oxygen with an extremely high probability, it is advantageous to form a lamp chamber space in which there is no oxygen. In the case in which the discharge vessel has a circular cross sectional shape, the linear distance to the article to be treated on the outside peripheral surface of the discharge vessel is different. An arrangement of the UV transmission component, especially a flat transmission component, is therefore a very good idea, in the sense of preventing the scattering of the amount of light of the UV radiation which reaches the article to be treated. One such technology is disclosed, for example, in Japanese patent disclosure document HEI 8-124540.

SUMMARY OF THE INVENTION

The object of the present invention is to advantageously eliminate the disadvantage of attenuation of the radiant light from the dielectric barrier discharge lamps by the UV transmission component in a treatment device or a treatment process in which dielectric barrier discharge lamps are used as the light source and in which the lamp chamber and the treatment chamber are separated from one another by a UV transmission component.

The object is achieved in accordance with the invention in a treatment device using dielectric barrier discharge lamps and with:

- a lamp chamber in which dielectric barrier discharge lamps are located and there is an inert gas atmosphere;
- a treatment chamber in which an article to be treated is located and there is a treatment gas atmosphere, and
- a UV transmission component by which the lamp chamber and the treatment chamber are separated from one another, in that, in the lamp chamber and the treatment chamber, there are a means for determining the gas pressure within the respective chamber, a means for delivering gas to the inside and a means for discharging gas, and a means which regulates the pressure of the gas atmosphere within the lamp chamber and the pressure of the gas atmosphere of the treatment chamber relative to one another by determining the gas pressures of the lamp chamber and the treatment chamber.

The object is achieved, in one development of the invention, in a treatment device using dielectric barrier discharge lamps, in that in addition to the above described arrangement, the pressure of the gas atmosphere of the lamp chamber is regulated according to the pressure of the gas atmosphere of the treatment chamber.

The object is moreover achieved in a treatment device using dielectric barrier discharge lamps in that, in addition to the above described arrangement, the gas atmosphere of the lamp chamber is regulated with respect to the pressure of the gas atmosphere of the treatment chamber such that the difference between the two is within ±0.2 atm.

The object is furthermore achieved in a treatment device using dielectric barrier discharge lamps in that, in addition to the above described arrangement, the gas atmosphere of the lamp chamber is regulated such that it is essentially identical to the pressure of the gas atmosphere of the treatment chamber.

The object is furthermore achieved in accordance with the invention in a treatment process using dielectric barrier discharge lamps by the following process steps:

Inert gas is delivered into the lamp chamber in which there are dielectric barrier discharge lamps;

Before or after this delivery of the inert gas or simultaneously with it, a treatment gas is admitted into the treatment chamber in which there is an article to be treated and which is separated from the lamp chamber by a UV transmission component;

The gas pressure of the treatment chamber and the gas pressure of the lamp chamber are each determined; and Based on the determination values thereof, the two gas pressures are regulated relative to one another.

According to one version of the invention, in the treatment process using dielectric barrier discharge lamps, the object is achieved in that, in addition to the above described arrangement, the above described relative regulation is carried out such that the difference between the two gas pressures is within ±0.2 atm.

The object is furthermore achieved in a treatment process using dielectric barrier discharge lamps in that in addition to the above described arrangement the above described relative regulation is carried out such that the two gas pressures are made essentially the same size.

The invention is further described below using the drawings.

Figure 1:
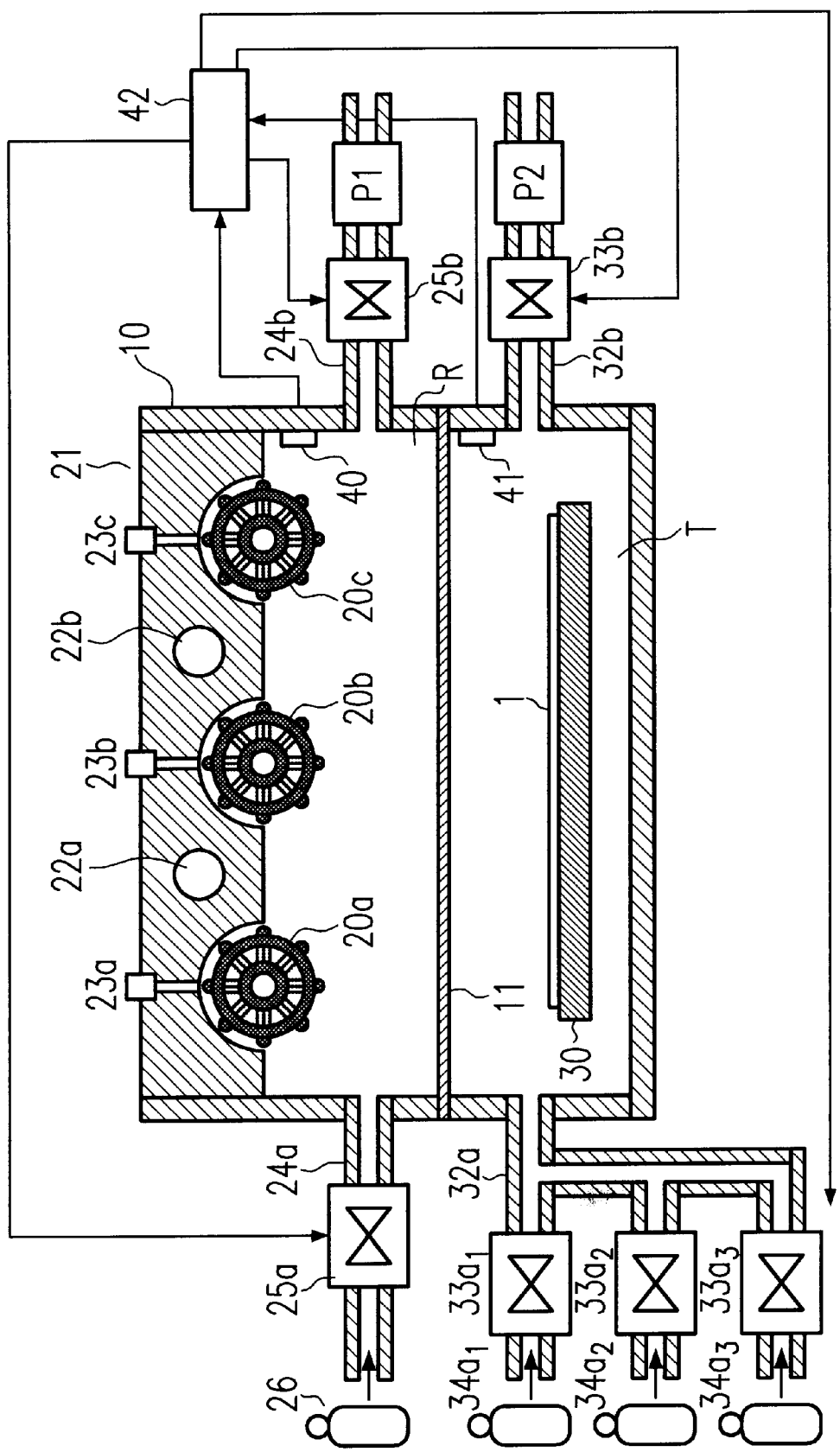
Figure 2A:
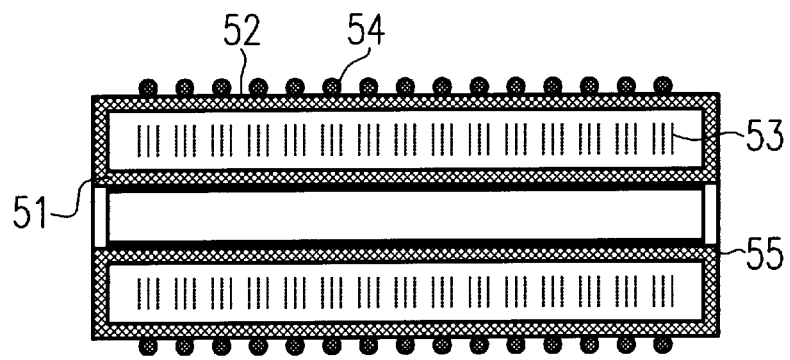

FIG. 1 shows a schematic of a treatment device as claimed in the invention using dielectric barrier discharge lamps;

FIGS. 2(a) and (b) each show a schematic of a dielectric barrier discharge lamp in a treatment device as claimed in the invention and FIG. 3 shows a schematic of a conventional treatment device using dielectric barrier discharge lamps.

DETAILED DESCRIPTION OF THE INVENTION

FIG. 1 shows a treatment device as claimed in the invention using dielectric barrier discharge lamps. In the figure, a UV treatment device 10 comprises a lamp chamber R and a treatment chamber T which are separated from one another by a UV transmission window component 11. The housing which surrounds the entire device 10 is made, for example, of stainless steel.

In the lamp chamber R there are dielectric barrier discharge lamps 20a, 20b, 20c in the trough-like groove of a metal block 21 in which there are cooling water passages 22a, 22b through which cooling water flows. For example, aluminum is used for the metal block 21 because it has a good heat transmission property, is easy to machine and furthermore, has a good reflection property for vacuum UV light.

Figure 2B:
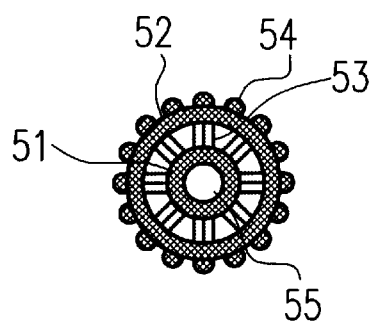

In the dielectric barrier discharge lamps 20a, 20b, 20c, there are sensors 23a, 23b, 23c for determining the radiant light. In this way, a non-operating state, such as the state in which the discharge lamps are not operating well or the like, can be determined. The dielectric barrier discharge lamp, as shown in FIGS. 2(a) & 2(b), has a cylindrical overall shape and is made of synthetic silica glass which acts as a dielectric in a dielectric barrier discharge and which transmits vacuum UV light. In the respective discharge lamp, there are an inner tube 51 and an outer tube 52 coaxial to one another, by which a double tube is formed. By closing the two ends, between the inner tube 51 and the outer tube 52, a discharge space 53, which is filled with a discharge gas, for example, xenon gas, is formed in which a dielectric barrier discharge produces excimer molecules and in which vacuum UV light is emitted by these excimer molecules.

Numerical values are described by way of example below.

In the discharge lamp 20:

the total length is 800 mm;

the outside diameter is 27 mm;

the outside diameter of the inner tube 51 is 16 mm; and the thickness of the inner tube 51 and the outer tube 52 is 1 mm.

The discharge lamp 20 is operated with 400 W.

The outside of the outer tube 52 is provided with a mesh electrode 54. The inside of the inner tube 51 is provided with an inner electrode 55 as the other electrode. The mesh electrode 54 is formed to be seamless and can expand overall. Thus, the tightness against the outer tube 52 can be improved. The inner electrode 55 is tubular or is made essentially in a C shape in which the cross section partially has a gap. It is thus directly located tightly against the inner tube 51. If necessary there is a getter in the discharge space 53.

Between the mesh electrode 54 and the inner electrode 55, an AC source (not shown) is connected. In this way, excimer molecules are formed in the discharge space 53 and vacuum UV light is emitted. In the case of using xenon gas as the discharge gas, light with a wavelength of 172 nm is emitted.

FIG. 1 shows an inlet 24a as a means for admitting the inert gas and an outlet 24b as a means for discharge, in order to fill the lamp chamber R with inert gas. The inlet 24a is connected via a valve 25a to a gas cylinder 26. The outlet 24b is likewise connected via a valve 25b to a vacuum pump P1.

Generally, nitrogen gas is used as the inert gas; however, argon gas or the like can also be used. The inert gas can be allowed to flow within the lamp chamber R during the treatment process continually or before and after treatment, its being admitted by the inlet 24a and discharged by the outlet 24b.

The reason for filling the lamp chamber R with inert gas is to prevent the radiant light from the dielectric barrier discharge lamps 20 from being absorbed by oxygen and attenuated. Since the UV transmission component 11 is a flatly compressed plate, the attenuation of the amount of light within the lamp chamber R can be suppressed essentially to 0. In this way, the amount of vacuum UV light which is uniform over the entire area of the UV transmission component 11 can be emitted by the UV transmission component 11 to the treatment chamber T. Furthermore, in the dielectric barrier discharge lamp 20, the outside of the discharge vessel is provided with an electrode 54. Oxidation of this electrode 54 can also be prevented.

In the treatment chamber T, on a holding frame 30, the article 1 to be treated is placed; it receives the UV radiation emitted by the dielectric barrier discharge lamps 20. This holding frame 30 is made, for example, of stainless steel. The article 1 to be treated can be heated by installing a filament heater using chromium-nickel wire in the holding frame 30. Furthermore, installing a device for movement up and down in the holding frame 30 (not shown) makes it possible to move the article 1 to be treated nearer the UV transmission component 11.

In order to fill the treatment chamber T with treatment gas, there are an inlet 32a and an outlet 32b through which the treatment gas flows. Gas cylinders $34a_1$, $34a_2$, $34a_3$ filled with different types of gas are each connected to the inlet 32a via valves $33a_1$, $33a_2$, and $33a_3$. By controlling the opening and closing of the respective valve, gas can be delivered from a certain cylinder. Furthermore, a gas mixture can also be admitted by opening several valves. A vacuum pump P2 is connected to the outlet 32b via a valve 33b.

The treatment gas can be oxygen gas, silane-based gas, hydrogen gas, argon gas and the like. Furthermore, to regulate the concentrations of these gases, an inert gas, such as nitrogen as or the like, is also used. The gas cylinders, which are connected to the valves $33a_1$, $33a_2$, and $33a_3$, are therefore filled with these gases. The number of cylinders is not limited to three, but can be chosen accordingly corresponding to the purpose of treatment.

In the lamp chamber R, there is a pressure sensor 40 as a means for determining the gas pressure. In the treatment chamber T, there is a pressure sensor 41 as a means for determining the gas pressure. The values determined by the valves are sent, for example, to a control element 42. For example, semiconductor pressure sensors are used for the pressure sensors 40, 41. The gas pressure of the respective treatment chamber can be determined.

The control element 42 has the function of comparing signals from the pressure sensor 40 to signals from the pressure sensor 41. It sends to the valve 25a which is connected to the inlet 24a of the lamp chamber R, a signal for controlling the valve in the case in which the gas pressure of the lamp chamber R differs from the gas pressure of the treatment chamber T, or in similar cases. In this way, the gas pressure of the lamp chamber R can be regulated such that it is made essentially equal to the gas pressure of the treatment chamber T.

The gas pressure of the lamp chamber R is, for example, 50 torr. In the case of the gas pressure of the treatment chamber T of 200 torr, the gas pressure of the lamp chamber R is lower than the gas pressure of the treatment chamber. Therefore, a signal for opening the valve 25a is sent so that the gas pressure of the lamp chamber R is increased in order to make the two equal.

The gas pressure of the lamp chamber R and the gas pressure of the treatment chamber T can be made essentially the same by this control. As a result, the thickness of the UV transmission component 11 can be reduced without adversely affecting the partition between the chambers with different gas pressures by a suction force or the like as a result of the pressure difference. By using a UV transmission component 11 with a small thickness, the attenuation of the UV radiation in this component can be reduced. The specific thickness differs depending on the size (area) and shape of the UV transmission component. Conventionally, for example, in a device in which a pressure difference of roughly 750 torr forms between the lamp chamber R and the treatment chamber T, a circular UV transmission component with a thickness of 18 mm at a diameter of 230 mm can be used. However, the pressure difference between the lamp chamber R and the treatment chamber T can be forced down essentially to 0 by the arrangement of the control device of the invention. In this way, the thickness of the UV transmission component at the same diameter was reduced to 3 mm.

In the above described embodiment, the gas pressure of the lamp chamber R is regulated with respect to the gas pressure of the treatment chamber T. However, the gas pressure of the treatment chamber T can also be regulated with respect to the gas pressure of the lamp chamber R. Furthermore, the two gas pressures can also be changed and regulated.

The reason for this is the following:

The inert gas which is supplied to the lamp chamber R and the treatment gas which is supplied to the treatment chamber T have the effects which are each originally required. There are therefore cases in which with consideration of only the pressure difference not just any gas concentration can ever be regulated.

Furthermore, it is of course possible to stop treatment in the case in which the pressure difference between the treatment chamber T and the lamp chamber R is too great, and in which therefore the above described regulation of the pressure difference is impossible.

In the above described embodiment, the gas pressure is regulated by controlling the valves on the inlet side. However, the gas pressure of the lamp chamber or the treatment chamber can also be regulated by the valves 25a, 33b on the outlet side, being subjected to opening and closing control and furthermore the rate of suction being increased by the vacuum pumps. In this case, the valves 25a, 33a on the inlet side can be opened or closed or also left open.

For regulating the gas pressure of the treatment chamber T and the gas pressure of the lamp chamber R, the above described measure that the pressure difference between the two is forced down essentially to zero was the best regulation. But a pressure difference can be allowed to a certain extent, when to this extent the UV transmission component is not adversely affected if this pressure difference were to arise between the treatment chamber T and the lamp chamber R.

This tolerance level differs depending on the size (area) and the shape of the UV transmission component, as was described above. In a diameter range from 180 to 530 mm of a conventional UV transmission component of such a UV treatment device, treatment can be advantageously done without increasing the thickness of the UV transmission component in the conventional manner (roughly 14 mm to 42 mm) when the pressure difference is ±0.2 atm, preferably within 0.1 atm, more preferably within 0.03 atm.

In this embodiment, a circular UV transmission component was described. The shape of the UV transmission component is, however, not limited to a circular shape, but can have a rectangular shape, an oval or other shape.

In the above described embodiment, the gas pressure of the treatment chamber T and the gas pressure of the lamp chamber R are each measured and the valves of the lamp chamber are automatically subjected to opening and closing control based on the evaluation in the control element. However, the valves can also be manually controlled by the gas pressure of the treatment chamber T and the gas pressure of the lamp chamber R being displayed by a pressure gauge or the like.

The treatment process of the treatment device in accordance with the invention using a dielectric barrier discharge lamp is described below.

(1) First, nitrogen gas is admitted into the lamp chamber R.

Both the valve 25a and also the valve 25b of the lamp chamber R are opened, the vacuum pump P1 is operated and a flow of nitrogen gas is produced.

(2) The inside of the treatment chamber T is subjected to pressure reduction (shifted into a vacuum state).

The reason for this is to remove the residual gas for the subsequent process in which treatment process gas is allowed to flow in. At the same time, with closing of the valve 33a on the side of the inlet of the treatment chamber T, the valve 33b is opened on the outlet side and the vacuum pump P2 is operated.

The gas pressure of the lamp chamber R is subjected to pressure regulation such that it is caused to approach the gas pressure of the treatment chamber T, i.e. the negative pressure. Specifically, according to the determination signal of the pressure sensor 41 of the treatment chamber T control is carried out so that the gas pressure of the lamp chamber R reaches the same value. For example, the valve 25b on the outlet side can be largely opened for this control and the operating performance of the vacuum pump increased.

(3) The treatment gas is delivered to the treatment chamber T next.

This takes place in order to carry out UV irradiation treatment. For example, in the case in which the article to be treated is a semiconductor wafer and in which its surface is subjected to cleaning treatment, the valve $33a_1$ is opened on the inlet side and oxygen gas is admitted into the treatment chamber T from the oxygen gas cylinder $34a_1$. Furthermore, to ensure the oxygen concentration which is necessary for treatment, the valve $33a_2$ on the inlet side is opened and nitrogen gas is also admitted from the nitrogen gas cylinder $34a_2$ into the treatment chamber T. Furthermore, the valve 33b is closed on the outlet side and the oxygen gas is mixed with the nitrogen gas in the treatment chamber T to form a gas mixture atmosphere.

The gas pressure of the lamp chamber R is subjected to pressure regulation such that it is caused to approach the gas pressure of the treatment chamber T, i.e., the pressure of the gas mixture of oxygen gas and nitrogen gas. Specifically, according to the determination signal of the pressure sensor 41 of the treatment chamber T, control is carried out so that the gas pressure of the lamp chamber R reaches the same value. For example, the valve 25b on the outlet side can be closed for control or the nitrogen gas allowed to continue to flow through an extremely small opening and in this way the gas pressure within the lamp chamber R can be increased.

Here, the gas pressure of the lamp chamber R is subjected to regulation with feedback by the pressure sensor 40 via the control element 42.

(4) Next the dielectric barrier discharge lamps are operated and the surface of the semiconductor wafer is in fact subjected to irradiation treatment.

Here, in the treatment chamber T, both the valve $33a_1$ and also the valve $33a_2$ on the inlet side are open. The valve 33b on the outlet side is also open. Thus, the gas mixture of oxygen gas and nitrogen gas continues to flow. In the lamp chamber R, both the valve 25a on the inlet side and also the valve 25b on the outlet side are opened, and the nitrogen gas continues to flow within the lamp chamber R.

Both the pressure sensor 41 of the treatment chamber T and also the pressure sensor 40 of the lamp chamber R are also operated in this state, and control of regulation is carried out by the control element 42 such that the gas pressure of the lamp chamber R is caused to approach the gas pressure of the treatment chamber T.

(5) Next, the dielectric barrier discharge lamps are turned off and irradiation of the semiconductor wafer is stopped. Here, in the treatment chamber T, the valve 33a on the inlet of the treatment chamber T is closed, the valve 33b on the outlet side is opened and the inside of the treatment chamber T is placed under a vacuum by the vacuum pump P2 (shifted into the negative pressure state) in order to discharge the remaining gas.

In this state, based on the determination signals of the pressure sensor 41 of the treatment chamber T and of the pressure sensor 40 of the lamp chamber R, the gas pressure of the lamp chamber R is subjected to regulation by the control element 42 such that it is caused to approach the gas pressure of the treatment chamber T, i.e., a vacuum (negative pressure state).

(6) Next, the door (not shown) of the treatment chamber T is opened and the semiconductor wafer is removed from it.

The inside of the treatment chamber T here reaches the gas pressure outside the device, i.e., atmospheric pressure. In this state, based on the determination signals of the pressure sensor 41 of the treatment chamber T and of the pressure sensor 40 of the lamp chamber R, the gas pressure of the lamp chamber R is subjected to control of regulation by the control element 42 such that it is caused to approach the gas pressure of the treatment chamber T, i.e., atmospheric pressure.

The treatment process of the UV irradiation device was described above using one example. In the case in which the same treatment process is continued or in similar cases, there are also cases in which, for example, the processes (2) and (4) are not required, in which the interior of the treatment chamber T is shifted into the negative pressure state.

One feature of the invention lies in always determining the gas pressure of the lamp chamber R and the gas pressure of the treatment chamber T by the pressure sensors and regulating the gas pressure difference between the two. When there is such a function, other, different control configurations can be imagined.

The treatment device as of the invention using dielectric barrier discharge lamps can be used for UV dry cleaning, surface oxidation, surface activating, photo-CVD treatment and the like. It goes without saying that the dielectric barrier discharge lamps are not limited to those lamps which are filled with xenon gas and which emit a wavelength of 172 nm, but that dielectric barrier discharge lamps can also be used which are filled with argon gas, krypton gas or the like. The shape of the dielectric barrier discharge lamp is not limited to the double cylinder shape shown in FIGS. 2(a) and 2(b), and of course, other shapes can also be used.

As was described above, in the treatment device of the invention using dielectric barrier discharge lamps, by the arrangement of the gas pressure sensors in the lamp chamber and the treatment chamber, the gas pressure difference between the interior of the two can be forced down almost to 0 or into an essentially tolerable range. Therefore, the thickness of the UV transmission component by which the lamp chamber and the treatment chamber are separated from one another can be reduced, and as a result of which, the attenuation of the UV radiation by the UV transmission component can be minimized.

I claim:

1. Treatment device using dielectric barrier discharge lamps, comprising:

a lamp chamber in which dielectric barrier discharge lamps are located and in which there is an inert gas atmosphere;

a treatment chamber in which an article to be treated is located and containing a treatment gas atmosphere, and a UV transmission component by which the lamp chamber and the treatment chamber are separated from one another, wherein the lamp chamber and the treatment chamber each have a means for determining the gas pressure within the respective chamber, a means for delivering gas to within the respective chamber and a means for discharging gas therefrom, and wherein a control means is provided for regulating the pressure of the gas atmosphere within the lamp chamber and the pressure of the gas atmosphere within the treatment chamber relative to one another using gas pressures of the lamp chamber and the treatment chamber determined by said means for determining.

2. Treatment device as claimed in claim 1, wherein the control means is adapted to regulate the pressure of the gas atmosphere of the lamp chamber according to the pressure of the gas atmosphere of the treatment chamber.

3. Treatment device as claimed in claim 1, wherein the control means is adapted to produce a pressure difference between the gas atmosphere of the lamp chamber and the gas atmosphere of the treatment chamber of ±0.2 atm.

4. Treatment device as claimed in claim 3, wherein the control means is adapted to adjust the pressure of the gas atmosphere of the lamp chamber to a value that is essentially identical to the pressure of the gas atmosphere of the treatment chamber.

5. Treatment process using dielectric barrier discharge lamps, comprising the steps of:

delivering an inert gas is into a lamp chamber in which there are dielectric barrier discharge lamps;

admitting a treatment gas into a treatment chamber in which there is an article to be treated and which is separated from the lamp chamber by a UV transmission component;

determining the gas pressure of the treatment chamber and the gas pressure of the lamp chamber; and based on the determined gas pressures, regulating the gas pressure of at least one of the lamp chamber and the treatment chamber relative to each other.

6. Treatment process as claimed in claim 5, wherein said admitting step is performed simultaneously with the delivering step.

7. Treatment process as claimed in claim 5, wherein said admitting step is performed subsequent to the delivering step.

8. Treatment process as claimed in claim 5, wherein said admitting step is performed prior to the delivering step.

9. Treatment process as claimed in claim 5, wherein the regulating step is carried out such that the difference between the gas pressures of the chambers is within ±0.2 atm.

10. Treatment process as claimed in claim 9, the regulating step is carried out such that the difference between the gas pressures of the chambers becomes essentially zero.

* * * * *